(12) United States Patent
Lu

(10) Patent No.: US 6,438,734 B1
(45) Date of Patent: Aug. 20, 2002

(54) FAST SEARCH METHOD FOR ENABLING A COMPUTER TO FIND ELEMENTARY LOOPS IN A GRAPH

(75) Inventor: Dingqing Lu, North Hills, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 552 days.

(21) Appl. No.: 08/944,379

(22) Filed: Oct. 6, 1997

(51) Int. Cl.$^7$ ............................................... G06F 17/50
(52) U.S. Cl. .................................... 716/7; 716/1; 716/4
(58) Field of Search ....................... 395/500.03, 500.09, 395/500.14, 500.07; 716/1–21

(56) References Cited

U.S. PATENT DOCUMENTS

| | | | |
|---|---|---|---|
| 5,375,074 A | * 12/1994 | Greenberg et al. | 395/500.38 |
| 5,555,270 A | * 9/1996 | Sun et al. | 371/27 |
| 5,857,097 A | * 1/1999 | Henzinger et al. | 395/583 |

OTHER PUBLICATIONS

Johnson, D.B., "Finding All the Elementary Circuits of a Directed Graph", SIAM Journal of Computing, vol. 4, Mar. 1975, pp. 77–84.*

Shih, H., Kovijanic, P.G., Razdan, R., "A Global Feedback Detection Algorithm for VLSI Circuits," Proceedings of IEEE International Conference on Computer Design: VLSI in Computers and Processors, Sep. 19, 1990, pp. 37–40.*

Jiang, B., "A Suitable Algorithm for Computing Partial Transitive Closures in Databases," Proceddings of the Sixth International Conference on Data Engineering, Feb. 9, 1990, pp. 264–271.*

Shih, H.–C.; Kovijanic, P.G.; Razdan, R., "A Global Feedback Detection Algorithm for VLSI Circuits", Computer Design: VLSI in Computers and Processors, 1990. ICCD '90. Proceedings, 1990 IEEE International Conference on, pp. 37–40.*

Jiang, B., "A Suitable Algorithm for Computing Partial Transitive Closures in Databases", Data Engineering, 1990. Proceedings, Sixth International Conference on, pp. 264–271.*

Hudli, R.V.; Seth, S.C., "Testability Analysis of Synchronous Sequential Circuits Based on Structural Data", Test Conference, 1989. Proceedings. Meeting the Tests of Time., International, pp. 364–372.*

* cited by examiner

Primary Examiner—Vuthe Siek

(57) ABSTRACT

A method for operating a computer to find elementary loops in a strongly connected component of a graph. In the basic method, the computer identifies a starting vertex from the vertices of the strongly connected component that have not been examined as a possible starting vertex for an elementary loop and which are not contained in any elementary loop discovered thus far. The vertices of the strongly connected component are then searched for a path starting and ending on the identified vertex. If the search finds a path starting and ending of the identified vertex, the path is recorded as an elementary loop. This process is repeated until no starting vertex can be identified. To improve the efficiency of the search process, the computer identifies vertices that are the starting vertex for a paths that are shared by more than one elementary loop. The shared paths are stored separately and used to avoid searching the vertices of the path more than once.

6 Claims, 2 Drawing Sheets

FAST SEARCH METHOD FOR ENABLING A COMPUTER TO FIND ELEMENTARY LOOPS IN A GRAPH

FIELD OF THE INVENTION

The present invention relates to circuit or system simulators and synthesis systems, and more particularly, to an improved method for finding elementary loops in a graph representing a circuit or system.

BACKGROUND OF THE INVENTION

One step in the analysis of a circuit or system involves the generation of a directed graph that represents the circuit. Consider the class of systems that can be described graphically by a block diagram in which each element of the system can be represented by a block and the connection between two elements can be represented by a line. Electronic circuits or systems fall into this class of systems. In order to analyze the system topology, the system block diagram can be mapped to a graph consisting of a plurality of vertices connected by "edges". Each vertex corresponds to one of the blocks in the block diagram, each edge in the graph corresponds to a connection between the blocks.

Many circuit simulation and synthesis problems require that all of the elementary loops (circuits or cycles) of the directed graph representing the circuit be located. A directed graph is a graph in which the edges specify a direction. In the case of a circuit, the direction represents the direction in which signals travel from one element (block) to the adjacent element. For example, to schedule a hierarchical communication system all of the feed back loops in the system must be found. One method for solving high-level DSP synthesis problems requires that all loops in a directed graph must be located.

Prior art methods for locating the loops in a directed graph are computationally to expensive to be applied to many problems of interest. For example, Taian's method (R. Tajan, "Depth-First Search and Linear Graph Algorithm", SIAM J. Comput. Vol.1, No.2, June, 1972 for more details) requires a time that is proportional to $(C+1)(VE)$, where V is the number of vertices in the graph, E is the number of edges, and C is the number of loops in the graph. In the worst case, C approaches E, and V is of order E. Hence the computational work load can be of order $V^3$. This workload is unacceptable for many practical applications.

Broadly, it is the object of the present invention to provide an improved method for finding the elementary loops of a directed graph representing a circuit.

It is a further object of the present invention to provide a method for finding the elementary loops of a graph which imposes a lower computational workload then prior art methods.

These and other objects of the present invention will become apparent to those skilled in the art from the following detailed description of the invention and the accompanying drawings.

SUMMARY OF THE INVENTION

The present invention is a method for operating a computer to find elementary loops in a strongly connected component of a graph. In the basic method, the computer identifies a starting vertex from the vertices of the strongly connected component. The potential vertices are those that have not been examined as a possible starting vertex for an elementary loop and which are not contained in any elementary loop discovered thus far. The vertices of the strongly connected component are then searched for a path starting and ending on the identified vertex. If the search finds a path starting and ending of the identified vertex, the path is recorded as an elementary loop. This process is repeated until no starting vertex can be identified. To improve the efficiency of the search process, the computer identifies vertices that are the starting vertex for paths that are shared by more than one elementary loop. The shared paths are stored separately and used to avoid searching the vertices of the path more than once.

DETAILED DESCRIPTION OF THE INVENTION

Figure 1:
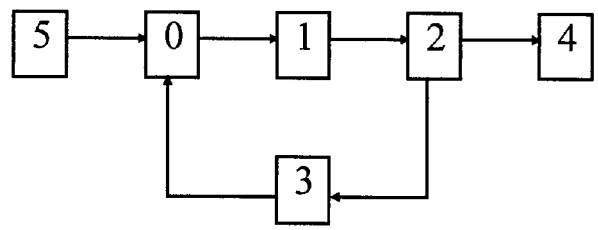
FIGS. 1–3 illustrate the decomposition of graph into strongly connected components using depth-first searches.

For the purposes of this discussion, $G=(V,E)$ will be used to denote a graph having vertices V and edges E. It is assumed that the set is non-empty and finite. Each edge connects two vertices and specifies the order for that connection. If $(u,v)$ is an edge of G, vertices u and v are said to be adjacent.

A path in a graph is a sequence of edges, $(v_1, v_2)$, $(v_2, v_3), \ldots, (v_n, v_{n+1}), (v_{n+1}, v_{n+2}), \ldots$ having the property that the terminal vertex of each edge is the initial vertex of the next edge. A path may be denoted by the sequence of vertices on it. An elementary path contains no vertex twice.

An elementary loop is a path that begins and ends on the same vertex, but contains no other vertex more than once. Two elementary loops whose edges are cyclic permutations of one another are defined to be identical.

A strongly connected component is defined to be the maximum set of vertices for which every pair of vertices in the set are reachable from each other.

The present invention may be viewed as finding the elementary loops in a directed graph via a two step process. In the first step, the graph is decomposed into strongly connected components. In the second step, each strongly connected component is analyzed for elementary loops.

It can be shown that all strongly connected components contain either one loop block or one vertex. However, nested loops can occur in a loop block. Therefore, the loop blocks need to be further analyzed to detect elementary loops. Algorithms for decomposing a graph into strongly connected components are known to the art. The reader is referred to R. Tarjan, "Depth-First Search and Linear Graph Algorithm", SIAM J. Comput. Vol.1, No.2, June, 1972 for more details.

The strongly connected components are found using a depth-first search strategy applied to the graph and the transpose of the graph as explained below. In the depth-first search, edges leaving the most recently discovered vertex, v, that still has unexplored edges leaving it are explored first. When all of the edges leaving this vertex have been explored, the search "backtracks" to explore edges leaving the vertex from which v was discovered. This process continues until all the vertices that are reachable from the original source vertex have been discovered. If any undiscovered vertices remain, then one of them is selected as a new source and the search is repeated from that source. This entire process is repeated until all vertices are discovered.

In the search, whenever a vertex is discovered during a scan of the adjacency list of an already discovered vertex u, the program records this event by setting v's predecessor field $\pi(v)$ to u. The predecessor subgraph of a depth-first search is therefore defined as $G_r=(V,E_r)$, where $E_i=\{(\pi(v), v); v \in V$ and $\pi(v) \neq NIL\}$ The predecessor sub-graph of depth-first search forms a depth-first forest composed of several depth first trees. The edges in $E_i$ will be referred to as tree edges.

In the depth-first search, a state variable is assigned to each vertex to assure that the vertex only appears in one depth-first tree. The states of this variable will be designated by colors in the following discussion; however, any method of denoting the different states may be utilized. Each vertex is initially set to the white state. The variable is set to the gray state when the corresponding vertex is discovered in the search, and is set to the black state when all edges leaving that vertex have been explored, i.e., when its adjacency list has been examined completely. This technique guarantees that each vertex ends up in exactly one depth-first tree, so that these trees are disjoint.

Two additional variables are stored for each vertex, d(u) and f(u). These variables store the value of a counter which is analogous to the "time" at which the vertex is discovered and the time at which the search of the edges leaving this vertex is completed. The depth-first search records the time at which it discovers vertex u in the variable d[u] and the time it finishes vertex u in variable f[u].

The following pseudocode shows the preferred embodiment of the depth-first search procedure for a graph G. The input graph G contains all network information. The variable time is a global variable that is used to store the above described counter.

DFS(G)
1. for each vertex u ∈ V(G)
2. do color[u]←white
3. π[u]←NIL
4. time←0
5. for each vertex u ∈ V(G)
6. do if color[u]=white
7. then DFS-Visit(u)
DFS-Visit(u)
1. color[u]←gray >White vertex u has just been discovered.
2. d[u]←time←time+1
3. for each v ∈ Adj[u] >Explore edge (u,v).
4. do if color [v]=white
5. then π[v]←u
6. DFS-Visit(v)
7. color [u]←black >Blacken u; it is finished.
8. f[u]←time←time+1

As noted above, the strongly connected components of the graph may be found by applying the depth-first search to the graph and the transpose of the graph. The strongly connected component of a directed graph G=(V,E) is a maximal set of vertices U ⊆ V such that for every pair of vertices u and v in U, both u→v and v→u; that is, vertices u and v are reachable from each other. The transpose of a graph G, denoted by $G^T$ is defined by $G^T=(V,E^T)$, where $E^T=\{(u,v):(v,u) \in E\}$. That is, $E^T$ consists of the edges of G with their direction reversed.

The preferred procedure for finding strongly connected components is as follows:
1. Call DFS (G) to compute finishing time f[u] for each vertex u.
2. Compute $G^T$.
3. Call DFS($G^T$), but in the main loop of DFS(step 5), consider the vertices in order of decreasing f[u].
4. Collect the vertices of each tree in the depth-first forest of step 3 as a separate strongly connected component.

Figure 2:
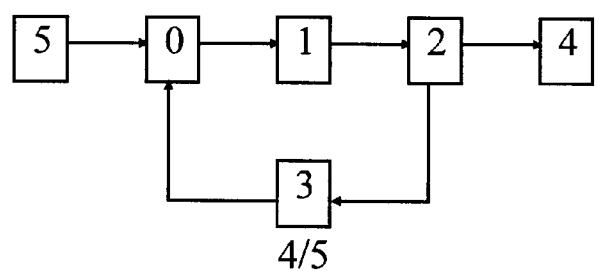
Figure 3:
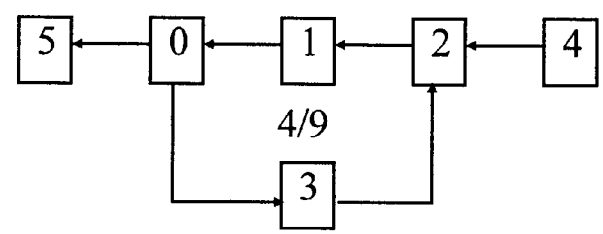

The manner in which the strongly connected components are found using this procedure may be more easily understood with reference to FIGS. 1–3 which illustrate the process on a simple graph having 5 vertices. FIG. 1 shows the graph in question. The beginning and ending times computed by the depth-first search described above are shown in FIG. 2. The new ordering of the vertices for use in searching the transposed graph is {5, 0, 1, 2, 4, 3}.

The transposed graph is shown in FIG. 3 with the starting and ending times assigned by the modified depth-first search in which the new ordering of the vertices is used in the loop shown at line 5 of DFS(G) procedure. It should be noted that this new ordering does not affect the order with which the vertices are visited by DFS-Visit(u) procedure. The three trees generated by the procedure are {5}, {1,2,3,0}, and {4}.

The present invention utilizes a novel analysis procedure for decomposing a strongly connected component to elementary loops. This procedure runs in linear time proportional to |V1|+|C|, where |V1| is the number of vertices for all loop members and |C| is the number of elementary loops in the graph. Hence, the present invention applied to the entire graph runs in linear time proportional to |V|+|E|+|V1|+|C|, where |V| is the number of vertices in the graph, and |E| is the number of edges in the graph.

As mentioned above, all strongly connected components contain either one loop block or one vertex. If the loop block is a nested loop, further analysis of the strong component is required to detect elementary loops of the graph. The method by which elementary loops are detected depends on the fact that any strongly connected component of a directed graph has the property that, for every pair of vertices u and v, both u→v and v→u; that is, vertices u and v are reachable from each other, and any vertex is reachable from itself.

The procedure for finding the elementary loops may be summarized as follows:
(1) Starting from the first vertex in the strongly connected component search for the first elementary loop. This procedure is guaranteed to find an elementary loop, since the first vertex can reach any vertex in the strongly connected component and any vertex in the strongly connected component is reachable by itself.
(2) Starting from another fresh vertex which is not included in any of the elementary loops found thus far, search for another elementary loop.
(3) Repeat step 2 until no fresh vertex is available.

If the strongly connected component only contains one elementary loop, a simple search will finish in a time which is proportional to the number of loop members. However, for nested loops, a simple search does not necessarily provide the shortest search time.

As will be explained in more detail below, an efficient searching method utilizes information from previous searches to prevent traversing paths more than once. However, to simplify the following discussion, the basic method for searching for elementary loops, which does not make full use of information from previous seaches, will first be explained. The manner in which this method may be improved will then be discussed.

The following pseudocode is the preferred embodiment of the basic search method for decomposing a strongly connected component $G_s$.

DecomposeScc($G_s$)
1. for each vertex u ∈ V ($G_s$)
2. do color[u]←white
3. stack[u]←0
4. stackMembers←0
5. Visit_New_Vertex($u_0$) >vertex $u_o$ ∈ V($G_S$)
Visit_New_Vertex(u)
1. color[u]←gray >White vertex u has just been visited.
2. stack[u]←u
3. stackMembers←stackMembers+1
4. for each v ∈ Adj[u] >Explore edge (u,v).

5. if color[v]=white
6. Visit_New_Vertex(v)
7. else if color[v]=gray >v has been visited two times, a loop has been detected.
8. Record the loop
9. color[u]←white
10. stackMembers←stackMembers−1

Figure 4:
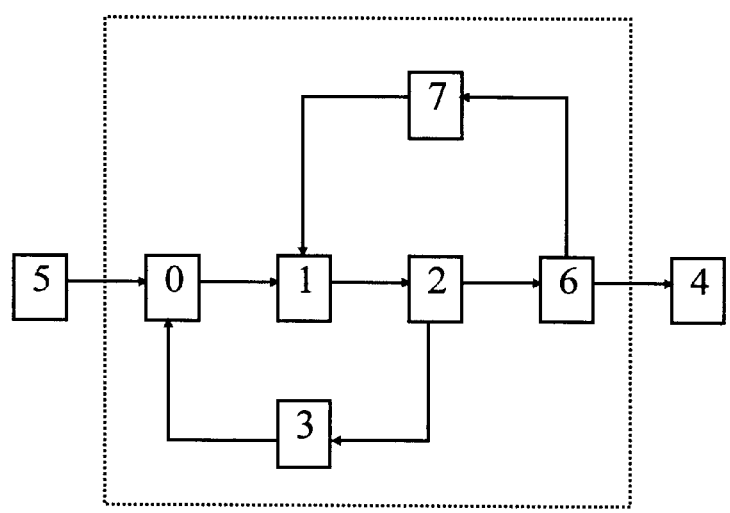
FIG. 4 illustrates a graph having a strongly connected component which includes two elementary loops.

The manner in which this method decomposes strongly connected components may be more easily understood with reference to FIG. 4 which illustrates a graph having two elementary loops. The application of the above described method for decomposing the graph into strongly connected components yields three strongly connected components, {5}, {0,1,2,6,3,7}, and {4}. The second of these must be decomposed.

The routine DecomposeScc( ) is called with vertex 0. This routine executes the following:

(1) Each vertex in strong component {0 1 2 6 3 7} is colored white at the beginning.
(2) Starting from the first vertex 0, call routine Visit_New_Vertex(0) recursively. If the vertex is a white one, visit it. The visited vertex needs to be grayed and recorded in the array stack [ ]. If the vertex is gray, this means a loop has been detected, since the vertex has been visited once before.

Before encountering a gray vertex, the visited vertices contained by array stack[ ] are [0 1 2 6 7]. After visiting 7, a gray vertex 1 is detected. This means a loop can be found in stack [ ], which is {1 2 6 7 1}.

After the elementary loop {1 2 6 7 1} is found, vertices in the visited branch are set to white color.

Then routine returns to Visit_New_Vertex(2) with edge (2,3).

(3) The next discovered vertex is 3. Now, the visited vertices contained by array stack[ ] are [0 1 2 3]. After visiting 3, a gray vertex 0 is detected. This means another loop is found in stack[ ], which is {0 1 2 3 0}. At this point, all of the vertices have been visited and the process is complete.

The basic method described above is not efficient for some complex cases. The above method may traverse a path shared by a number of loops more than once. This leads to inefficient use of computing resources. This inefficiency can be avoided by defining a new status for a special class of vertices. The new state will be denoted by "red". The class of vertices consists of multi-input vertices that are not the starting point of an elementary loop. A multi-input vertex is one having a plurality of inbound edges.

A path that is shared by more than one elementary loop is defined to be a "red path" in the following discussion. Since each red path is shared by several loops in the search, once the red path is visited, it is not necessary to visited it again. On the first visit to a red path, the red path is recorded. When visited again, the red path can be loaded to form the new loops. Each red vertex is followed by red paths.

The basic method can be improved by modifying several lines of code in Visit_New_Vertex(u) as shown below. The modified method executes the following steps:

(1) Each vertex in the strongly connected component is set to the white state at the beginning of the search. The method starts from the first vertex of the strongly connected component.
(2) If a white vertex is encountered, visit it by calling the version of Visit_New_Vertex( ) shown below. In the Visit_New_Vertex the visited vertex is grayed and recorded in the stack.

If the encountered vertex is gray, a loop has been detected, since the vertex has been visited before. This loop is recorded. If there is any multi-input vertex that is not the first loop member, then there are also red paths to be recorded. The red paths are recorded on a second stack, "the red path stack".

If the encountered vertex is red, a loop can be found through the red path related to the red vertex. Since the red paths have been found the search is stopped. At this point, loop members are loaded from the stack and the red path stack.

Before finishing the search, a single input vertex is assigned the color black and a multi-input vertex that was gray is assigned the color red.

(4) Continue to call routine Visit_New_Vertex( ) recursively until all vertices have been visited.

Pseudocode for implementing the above described method is as follows:

Visit_New_Vertex(u)
1. color[u]←gray >white vertex u has just been visited
2. stack[u]←u
3. stackMembers←stackMembers+1
4. for each v ∈ Adj[u] >Explore edge (u,v).
5. if color [v]=white
6. a: Visit_New_vertex(v)
7. else if color{v}=gray >v loop detected; v has been visited before.
8. b: Record the loop >Load loop members from stack
   && put Red_paths >if the loop contains any multi-input vertex, w, that is not the first loop member, there exists, at least,
   one red vertex. Record red paths starting from w and ending at v in a red_path_stack
9. else if color[v]=red
10. c: Get Red paths >Get red paths starting from the red vertex and ending at vertices in the vertex stack.
    && output loops >Load loop members from stack and red path stack.
11. if numInput(u)<2 >The search has been finished for u
12. color[u]←black
13. else if color[u]=gray >A red vertex has been identified.
14. color[u]←red
15. stackMembers←stackMembers−1

Figure 5:
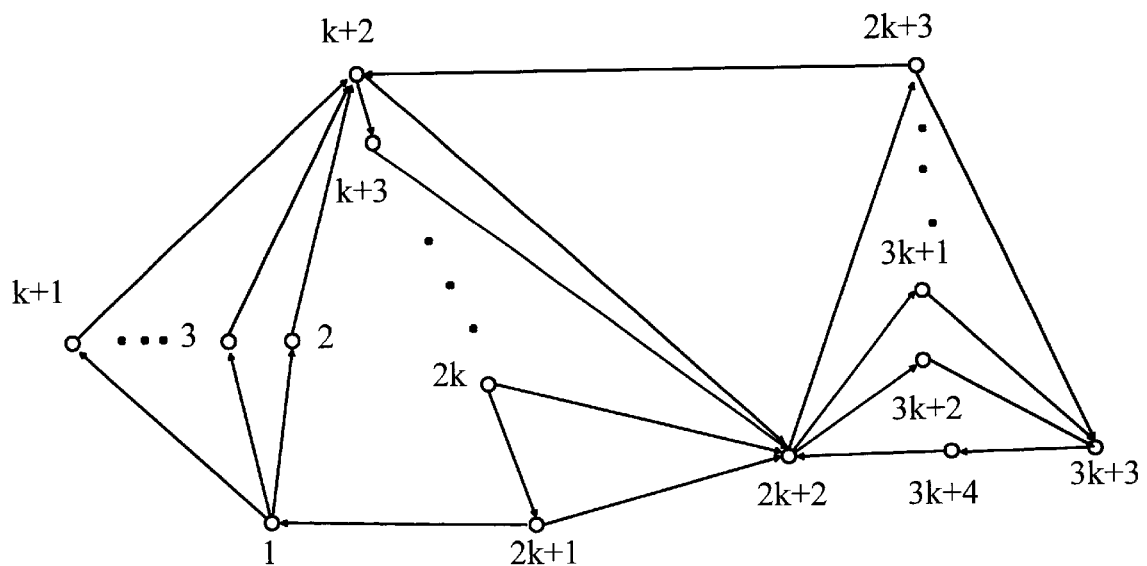
FIG. 5 illustrates a graph having a complex loop structure.

The manner in which this embodiment of the method operates may be more easily understood with reference to FIG. 5 which is a graph of a strongly connected component with complex nested loops. This example is also corresponds to the worst case of Taijan's method referenced above. If the basic search method described above is utilized, the method begins with vertex 1 and, in any search from vertex 1 through k+1, it visits vertex k+2 through 2k+1 before a first visit to vertex 2k+2. In the course of finding each of the k elementary loops which contain vertex 1, the subgraph on vertices 2k+2 through 3k+3 will be explored k times, once for each vertex k+2 through 2k+1. Thus exploration from vertex 1 alone consumes $O(k^3)$ time.

The improved method described above operates as follows. The search starts from vertex 1. Before encountering a gray vertex, assume that the visited vertices contained by array stack[ ] are [1, 2, k+2, 2k+2, 3k+2, 3k+3, 3k+4]. After visiting 3k+4, the gray vertex 2k+2 is encountered again. This means a loop can be found in stack[ ], which is {2k+2 3k+2 3k+3 3k+4 2k+2}. This loop is recorded. Since there is a multi-input vertex 3k+3 in the loop, a red paths needs to be recorded in a red_path_stack[3k+3][ ]. It can be seen that the vertex 3k+3 related to a red path (3k+3−>3k+4−>2k+2). This red path is then recorded. After this, the vertex 3k+3 is colored as red vertex.

The preferred method for recording the red paths is to use a stack as described above. However, it will be apparent to those skilled in the art that any form of table can be used.

When a red vertex is encountered, the red paths from that vertex are searched to determine if the endpoint of the red path is also on the array stack that records the vertices of the current search. If it is, then an elementary loop exists which starts and ends with the vertex on the array stack that coincides with the end of the red path. If the end of the red path is not on the array stack, then the path that end via the red path is not an elementary loop.

Referring again to FIG. 5, routine Visit_New_Vertex( ) next drives the search point back to vertex 2k+2 automatically, and continuously search along a new edge (2k+2->3k+1). Next, the red vertex 3k+3 is encountered. At this point, the vertices in the array stack[ ] are [1, 2, k+2, 2k+2, 3k+1]. Since the tail of the red path starting at 3k+3, 2k+2, is in the stack, the program needs only to load loop members from the stack[ ] and the red_path_stack[3k+3][ ], and a new loop {2k+2, 3k+1, 3k+3, 3k+4, 2k+2} is found. Hence, all loops related to red path (3k+3->3k+4->2k+2) can be found without duplicating the search along the red path.

Vertex 2k+2 is also the starting point of another loop {k+2, 2k+2, 2k+3, k+2}. When recording this loop a red path related to 2k+2 is found, that includes two edges (2k+2->2k+3) and (2k+3->k+2). After the program finishes searching for all remaining vertices adjacent to vertex 2k+2, vertex 2k+2 is colored red, and the search path stored on the array stack is popped back to k+2.

All loops starting from k+2 can be found without duplicating a search path, since the red path (2k+2->2k+3->k+2) has been recorded on the red path stack. The remaining loops are {k+2, k+3, 2k+2, 2k+3, k+2}, {k+2, k+3, k+4, 2k+2, 2k+3, k+2}, . . . , and {k+2, k+3, k+4, . . . . 2k, 2k+1, 2k+2, 2k+3, k+2}.

The program then detects another loop {1, 2, k+2, k+3, . . . , 2k+1, 1}. When recording this loop a red path related to k+2 is found, that includes the edges (k+2->k+3-> . . . ->2k+1->1). After finishing searching for all post-adjacent vertices, vertex k+1 is colored red, and search is back to 1.

All loops starting from 1 can be found without duplicating search because the red path edges (k+2->k+3-> . . . ->2k+1->1) are on the red path stack. These loops are {1, 3, k+2, k+3, . . . , 2k+1, 1}, {1, 4, k+2, k+3, . . . 2k+1, 1}, . . . , {1, k, k+2, k+3, . . . , 2k+1, 1}, and {1, k+1, k+2, k+3, . . . , 2k+1, 1}.

While the above embodiments of the present invention have referred to a "stack" for storing paths in the in depth search, such as the array path described above, other forms of storage on the computer may be utilized. For example, any form of ordered array may be used, provided the order in which the elements stored in the array were entered can be determined at any time. Accordingly, the term "stack" as used herein is meant to include any ordered storage array in which the last entry to be added may be retrieved and a new entry can be made.

The improved method described above avoids the duplication of paths by recording paths that have the potential of being included in more than one path. These paths start on a vertex that has multiple inputs. A similar method could be constructed utilizing paths that have multiple outputs as the "anchor" of the "red" paths.

The "red" paths also include paths that do not have internal branches within the paths such as path {3k+3->3k+4->2k+2} shown in FIG. 5. Such paths can be reduced to a simple path consisting of only the end points of the path. For example, this path could be replaced by a path {3k+3->2k+2} without altering the results of the elementary loop search, provided the path is marked in a manner that allows it to be re-expanded after the loops are enumerated. In the preferred embodiment of the present invention, the red paths, in effect, provide this substitution, since only the end points of a red path are utilized after the red path is enumerated.

However, embodiments in which such non-branched paths are replaced prior to beginning the search will also be apparent to those skilled in the art from the above discussion. For example, all such non-branched paths could be replaced in the original graph thereby generating a reduced graph G'. The above described method would then be applied to the reduced graph. Since the number of vertices in the reduced graph is fewer than in the original graph, the computational workload associated with finding the strongly connected components is also reduced.

Various modifications to the present invention will become apparent to those skilled in the art from the foregoing description and accompanying drawings. Accordingly, the present invention is to be limited solely by the scope of the following claims.

What is claimed is:

1. A method for operating a computer to find elementary loops in a graph comprising a plurality of vertices connected by directed edges, said method comprising the steps of: decomposing said graph into strongly connected components, and analyzing each strongly connected component for elementary loops, said analysis of one of said strongly connected components comprising the steps of:

(a) identifying a starting vertex from said vertices of said strongly connected component that have not been examined as a possible starting vertex for an elementary loop and which are not contained in any elementary loop discovered thus far; and (b) searching said vertices of said strongly connected component for a path starting and ending on said identified vertex, and recording said path if said search finds a path starting and ending of said identified vertex;

(c) repeating steps (a) and (b) until no starting vertex can be identified.

2. The method of claim 1 wherein said graph includes a path having a starting vertex, and ending vertex, and one or more intermediate vertices, wherein each intermediate vertex in that path has precisely one input edge and one output edge, and wherein said method further comprises replacing that path by a path consisting of said starting vertex connected directly to said ending vertex with no intermediate vertices therebetween.

3. The method of claim 1 wherein step (b) comprises performing a depth first search starting on said starting vertex, said vertices of said depth first search being stored in a first storage array during said search.

4. The method of claim 3 further comprising the steps of:

storing a state variable for each vertex of said strongly connected component in said computer, said state variable having a first value indicating that said vertex has not been examined, a second value indicating that said vertex has been examined, and a third value indicating that said vertex is the start of a path that may be shared by more than one elementary loop; and storing paths that begin on a vertex whose state variable is set to said third value in a second storage array.

5. The method of claim 4 wherein said state variable of a vertex having a plurality of edges input thereto is set to said third value.

6. The method of claim 4 further comprising the step of examining each path in said second array having a starting point on a specified vertex to determine if said path ends on a vertex stored in said first storage array.

* * * * *